US009041903B2

(12) United States Patent
Nelson et al.

(10) Patent No.: US 9,041,903 B2
(45) Date of Patent: May 26, 2015

(54) MASK INSPECTION WITH FOURIER FILTERING AND IMAGE COMPARE

(75) Inventors: Michael L. Nelson, West Redding, CT (US); Harry Sewell, Ridgefield, CT (US); Eric Brian Catey, Danbury, CT (US)

(73) Assignee: ASML Holding N.V.

( * ) Notice: Subject to any disclaimer, the term of this patent is extended or adjusted under 35 U.S.C. 154(b) by 645 days.

(21) Appl. No.: 13/256,372

(22) PCT Filed: Mar. 18, 2010

(86) PCT No.: PCT/EP2010/053524
§ 371 (c)(1),
(2), (4) Date: Dec. 14, 2011

(87) PCT Pub. No.: WO2010/118927
PCT Pub. Date: Oct. 21, 2010

(65) Prior Publication Data
US 2012/0075606 A1   Mar. 29, 2012

Related U.S. Application Data

(60) Provisional application No. 61/168,833, filed on Apr. 13, 2009.

(51) Int. Cl.
*G03B 27/52* (2006.01)
*G03B 27/68* (2006.01)
*G03F 1/84* (2012.01)

(52) U.S. Cl.
CPC .................................. *G03F 1/84* (2013.01)

(58) Field of Classification Search
CPC ........................................................ G03F 1/84

USPC .................................. 355/67, 52, 30; 356/388
See application file for complete search history.

(56) References Cited

U.S. PATENT DOCUMENTS 5,098,191 A * 3/1992 Noguchi et al. .............. 356/394
5,276,498 A   1/1994 Galbraith et al.
(Continued)

FOREIGN PATENT DOCUMENTS

CN       1532542 A     9/2004
CN       1573566 A     2/2005
(Continued)

OTHER PUBLICATIONS

Machine Translation of JP 08327557 A.*
(Continued)

*Primary Examiner* — Deoram Persaud
(74) *Attorney, Agent, or Firm* — Sterne, Kessler, Goldstein & Fox P.L.L.C.

(57) ABSTRACT

A mask inspection system with Fourier filtering and image compare can include a first detector, a dynamic Fourier filter, a controller, and a second detector. The first detector can be located at a Fourier plane of the inspection system and can detect a first portion of patterned light produced by an area of a mask. The dynamic Fourier filter can be controlled by the controller based on the detected first portion of the patterned light. The second detector can detect a second portion of the patterned light produced by the section of the mask and transmitted through the dynamic Fourier filter. Further, the mask inspection system can include a data analysis device to compare the second portion of patterned light with another patterned light. Consequently, the mask inspection system is able to detect any possible defects on the area of the mask more accurately and with higher resolution.

20 Claims, 10 Drawing Sheets

(56) References Cited

U.S. PATENT DOCUMENTS

| | | | |
|---|---|---|---|
| 5,506,676 | A * | 4/1996 | Hendler et al. ............ 356/237.1 |
| 5,548,401 | A * | 8/1996 | Ozaki ........................ 356/239.3 |
| 5,572,598 | A * | 11/1996 | Wihl et al. .................... 382/144 |
| 6,268,093 | B1 * | 7/2001 | Kenan et al. .................... 430/30 |
| 6,466,315 | B1 * | 10/2002 | Karpol et al. ............. 356/237.4 |
| 6,686,602 | B2 | 2/2004 | Some |
| 6,727,987 | B2 * | 4/2004 | Yonezawa ................ 356/237.2 |
| 6,879,391 | B1 | 4/2005 | Danko |
| 6,879,393 | B2 | 4/2005 | Koizumi et al. |
| 7,041,998 | B2 | 5/2006 | Weiss et al. |
| 7,436,505 | B2 | 10/2008 | Belyaev et al. |
| 8,059,261 | B2 | 11/2011 | Verweij et al. |
| 2002/0025479 | A1 * | 2/2002 | Okamoto et al. ................. 430/5 |
| 2003/0048939 | A1 * | 3/2003 | Lehman ........................ 382/144 |
| 2003/0132405 | A1 * | 7/2003 | Some ...................... 250/559.45 |
| 2004/0188643 | A1 | 9/2004 | Weiss et al. |
| 2005/0020073 | A1 | 1/2005 | Perry |
| 2005/0166171 | A1 * | 7/2005 | Bartov ............................ 716/19 |
| 2007/0258086 | A1 * | 11/2007 | Bleeker et al. ............ 356/237.4 |
| 2008/0013824 | A1 | 1/2008 | Yamaguchi et al. |
| 2010/0149548 | A1 * | 6/2010 | Shmarev et al. ............. 356/517 |
| 2011/0063621 | A1 * | 3/2011 | Konno ......................... 356/491 |
| 2012/0081684 | A1 * | 4/2012 | Den Oef et al. ................ 355/67 |

FOREIGN PATENT DOCUMENTS

| | | | | |
|---|---|---|---|---|
| JP | 08327557 | A * | 12/1996 | ............ G01N 21/88 |
| JP | 10-504905 | A | 5/1998 | |
| JP | 2002-049143 | A | 2/2002 | |
| JP | 2004-286741 | A | 10/2004 | |
| JP | 2005-535869 | A | 11/2005 | |
| JP | 2007-279040 | A | 10/2007 | |
| JP | 2008-020251 | A | 1/2008 | |
| TW | 200516659 | A | 5/2005 | |
| WO | WO 03/060489 | A2 | 7/2003 | |
| WO | WO 2007/075496 | A2 | 7/2007 | |

OTHER PUBLICATIONS

International Search Report directed to related International Patent Application No. PCT/EP2010/053524, mailed Jun. 25, 2010, from the European Patent Office; 3 pages.

International Preliminary Report on Patentability with the Written Opinion of the International Searching Authority directed to related International Patent Application No. PCT/EP2010/053524, issued Oct. 18, 2011, from the International Bureau of WIPO; 8 pages.

English-Language Abstract for Japanese Patent Publication No. 2004-286741 A, published Oct. 14, 2004; 1 page.

* cited by examiner

MASK INSPECTION WITH FOURIER FILTERING AND IMAGE COMPARE

CROSS-REFERENCE TO RELATED APPLICATIONS

This application claims the benefit of U.S. provisional application 61/168,833, which was filed on Apr. 13, 2009, and which is incorporated herein in its entirety by reference.

BACKGROUND

1. Field of the Invention

The present invention generally relates to lithography, and more particularly to a method and system for mask inspection.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To image smaller features, it has been proposed to use extreme ultraviolet radiation (EUV) with a wavelength in the range of 5-20 nanometers, in particular, 13.5 nanometers, or a charged particle beam, e.g., an ion beam and an electron beam, as the exposure radiation in a lithographic apparatus. These types of radiation need the beam path in the apparatus to be evacuated to avoid absorption. Since there are no known materials for making a refractive optical element for EUV radiation, EUV lithographic apparatus use mirrors in the radiation, illumination and projection systems. Such mirrors are highly susceptible to contamination, thereby reducing their reflectivity and hence the throughput of the apparatus. Further, sources for EUV may produce debris whose entry into the illumination system should be avoided.

As the dimensions of ICs decrease and the patterns being transferred from the mask to the substrate become more complex, detecting irregularities, defects, etc. (herein after defects) associated with a pattern formed on the mask becomes increasingly important. Consequently, defects in the features formed on the mask translate into pattern defects formed on the substrate. Mask defects can come from a variety of sources such as, for example, defects in coatings on mask blanks, the mask patterning process in a mask shop, and mask handling and contamination defects in a wafer fabrication facility. Therefore, inspection of masks for defects is important to minimize or remove unwanted particles and contaminants from affecting the transfer of a mask pattern onto the substrate.

Masks are inspected for any possible defects using pattern imaging and analysis systems. One way to detect defects is by comparing optical images from nominally identical patterns. Differences between the compared optical images can indicate defect areas. Another way to detect defects is by comparing the inspected pattern to a design database with differences indicating defect areas. However, pattern imaging and analysis systems tend to be slow, expensive, and resolution can be limited.

Laser scanning systems are used to inspect masks to detect presence of defects generated by contamination particles. The contamination is detected by detecting scattered light produced by the particles. These systems are used in particular for inspecting mask blanks or pellicles protecting mask patterns. However, the laser scanning systems are limited in their particle size resolution, particularly on EUV patterned masks. The pattern is etched into an absorber layer, which has a significant scattering cross-section. Scattered light produced by the pattern in the absorber layer can make it impossible to detect scattered light produced by a small particle.

Fourier filters have been proposed to block light scattered from an etched pattern and to pass light scattered from random defects. However, Fourier filters are pattern specific and must be tuned for each and every pattern. Programmable Fourier filters have been proposed, but only filtering the etched pattern in not efficient enough.

SUMMARY

Given the foregoing, what is needed is an improved method and system for mask inspection to enhance defect detection and improve detection sensitivity for small particles.

An embodiment of the present invention provides a mask inspection system comprising a first detector, a dynamic Fourier filter, a controller, and a second detector. The first detector is located at a Fourier plane of the mask inspection system and configured to detect a first portion of patterned light produced by a section of a mask. The dynamic Fourier filter is configured to be controlled by the controller based on the detected first portion of the patterned light. The second detector is configured to detect a second portion of the patterned light produced by the section of the mask and transmitted through the dynamic Fourier filter. In one example, a beam splitter can be used to produce the first and second portions of the patterned light.

Another embodiment of the present invention provides a method to inspect a mask for defects including the following steps. Detecting a Fourier image of a first portion of patterned light produced by a mask. Controlling a Fourier filter based on the detected Fourier image. Filtering a second portion of the patterned light using the Fourier filter. Detecting the filtered second portion. In one example, the detected filtered second portion is compared with another filtered patterned light.

A further embodiment of the present invention provides a lithography system comprising a support, a substrate table, a projection system, and the above described mask inspection system. The support is configured to support a patterning structure configured to pattern in a beam of radiation. The substrate table is configured to hold a substrate. The projection system is configured to project the patterned beam onto a target portion of the substrate.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts.

FIGS. 1A and 1B respectively depict reflective and transmissive lithographic apparatuses.

Figure 1A:
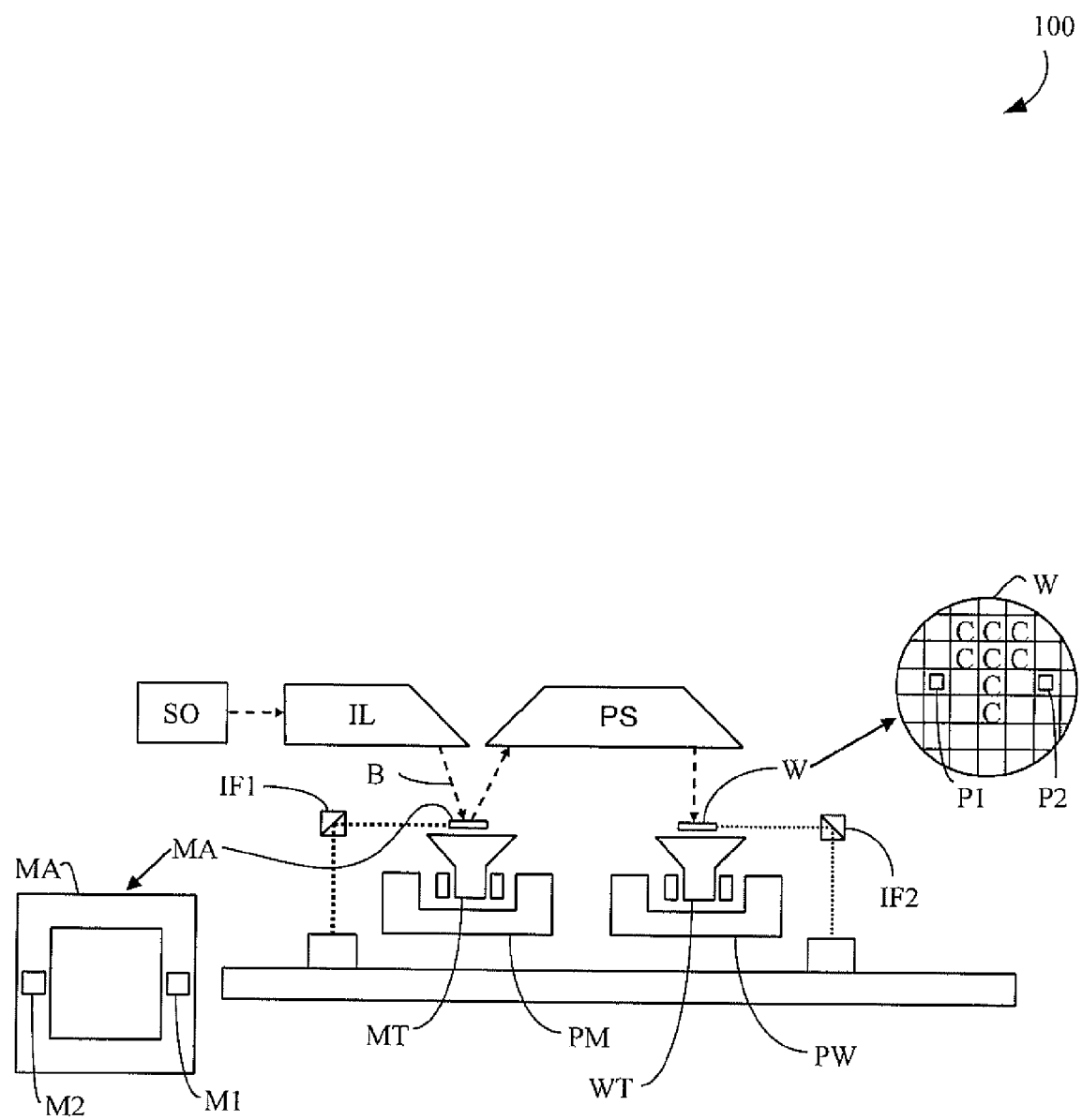

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

I. An Example Lithographic Environment

A. Example Reflective and Transmissive Lithographic Systems

Figure 1B:
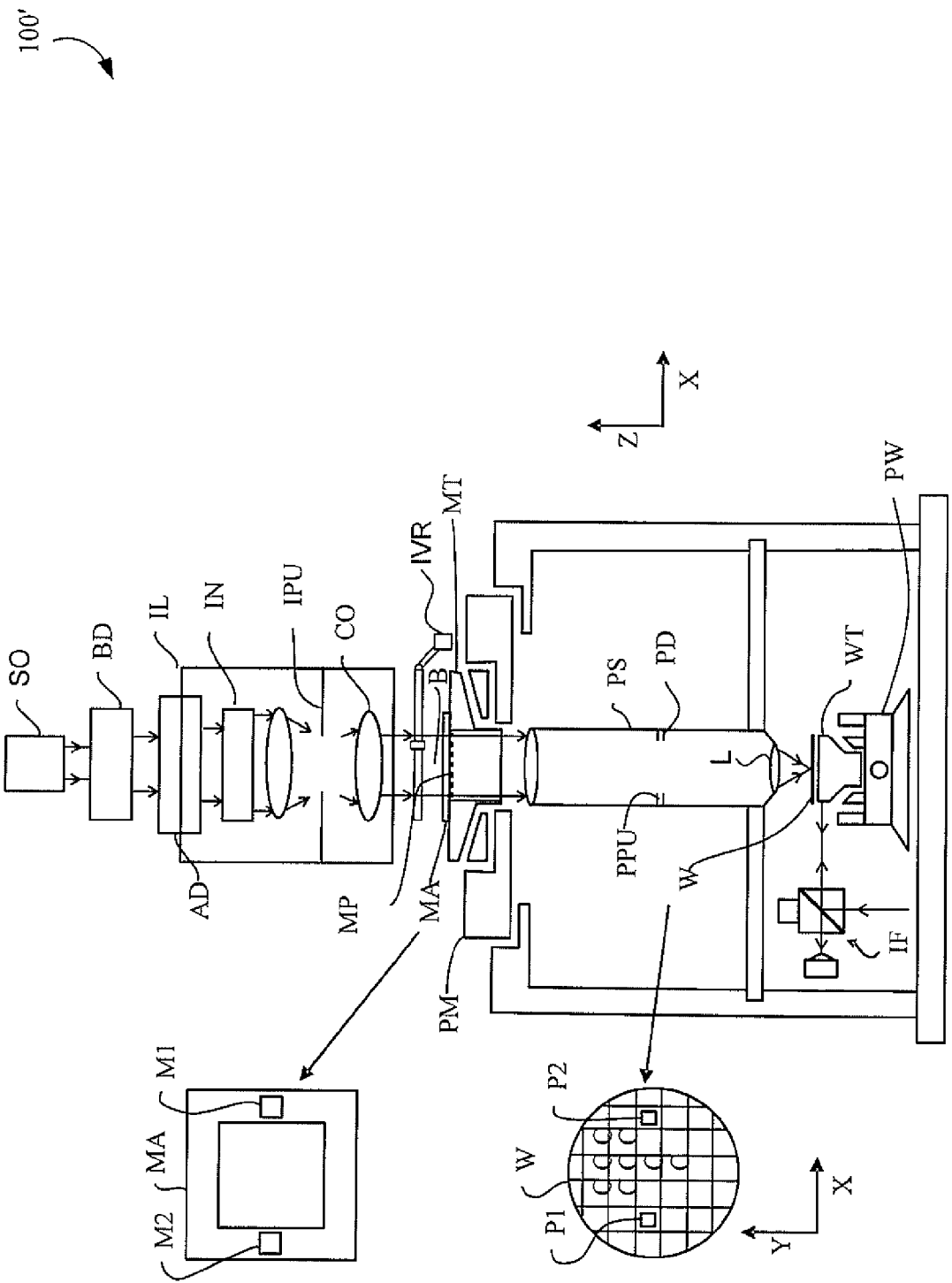

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., comprising one or more dies) C of the substrate W. In lithographic apparatus 100 the patterning device MA and the projection system PS is reflective, and in lithographic apparatus 100' the patterning device MA and the projection system PS is transmissive.

The illumination system IL may include various types of optical components, such as refractive, reflective, magnetic, electromagnetic, electrostatic or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) comprising, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may comprise an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes:

1. In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.
2. In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.
3. In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

B. Example EUV Lithographic Apparatus

Figure 2:
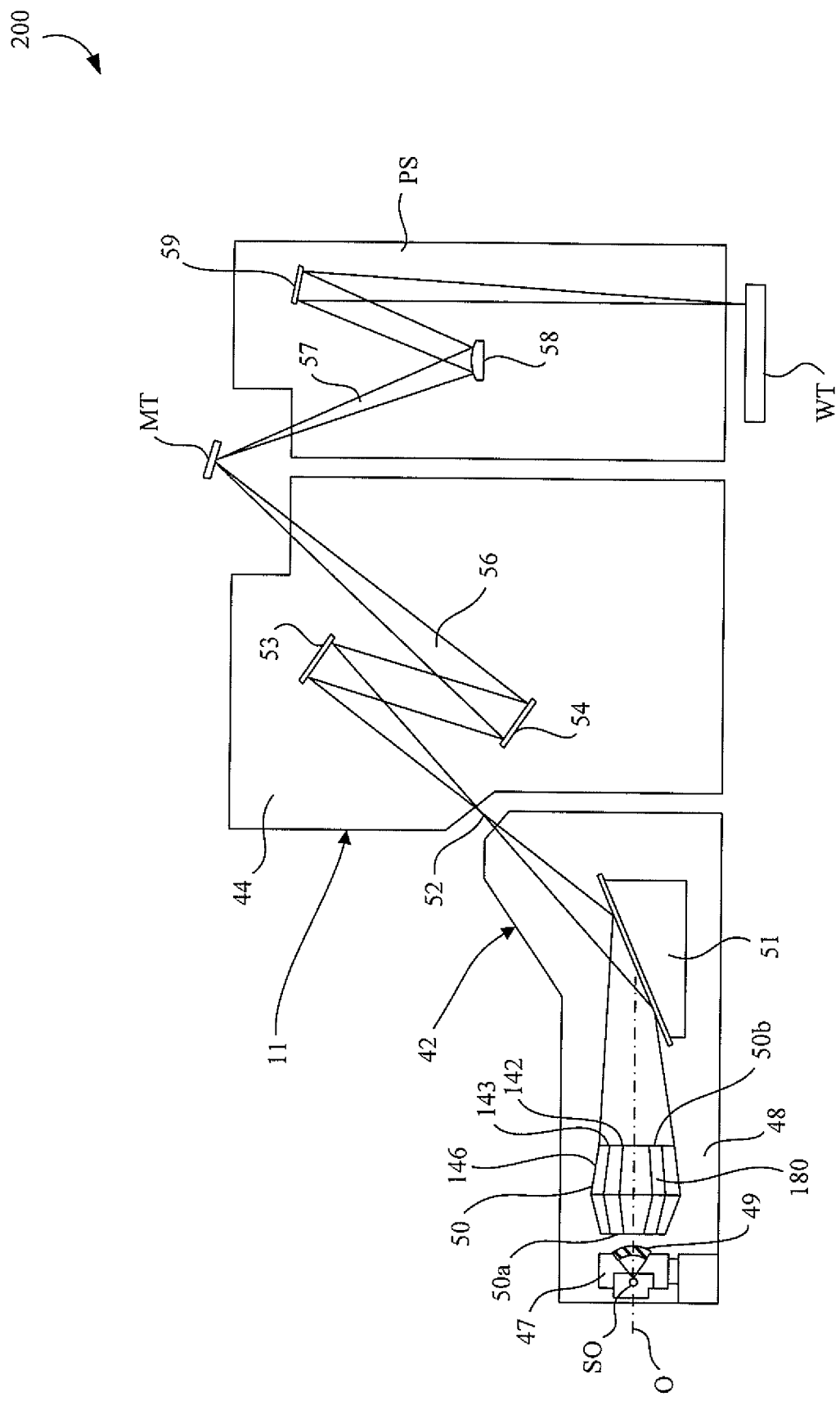
FIG. 2 depicts an example EUV lithographic apparatus.

FIG. 2 schematically depicts an exemplary EUV lithographic apparatus 200 according to an embodiment of the present invention. In FIG. 2, EUV lithographic apparatus 200 includes a radiation system 42, an illumination optics unit 44, and a projection system PS. The radiation system 42 includes a radiation source SO, in which a beam of radiation may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (which may also be called collector mirror or collector) that may be formed from a grazing incidence collector. Radiation collector 50 has an upstream radiation collector side 50a and a downstream radiation collector side 50b, and radiation passed by collector 50 can be reflected off a grating spectral filter 51 to be focused at a virtual source point 52 at an aperture in the collector chamber 48. Radiation collectors 50 are known to skilled artisans.

From collector chamber 48, a beam of radiation 56 is reflected in illumination optics unit 44 via normal incidence reflectors 53 and 54 onto a reticle or mask (not shown) positioned on reticle or mask table MT. A patterned beam 57 is formed, which is imaged in projection system PS via reflective elements 58 and 59 onto a substrate (not shown) supported on wafer stage or substrate table WT. In various embodiments, illumination optics unit 44 and projection system PS may include more (or fewer) elements than depicted in FIG. 2. For example, grating spectral filter 51 may optionally be present, depending upon the type of lithographic apparatus. Further, in an embodiment, illumination optics unit 44 and projection system PS may include more mirrors than those depicted in FIG. 2. For example, projection system PS may incorporate one to four reflective elements in addition to reflective elements 58 and 59. In FIG. 2, reference number 180 indicates a space between two reflectors, e.g., a space between reflectors 142 and 143.

In an embodiment, collector mirror 50 may also include a normal incidence collector in place of or in addition to a grazing incidence mirror. Further, collector mirror 50, although described in reference to a nested collector with reflectors 142, 143, and 146, is herein further used as example of a collector.

Further, instead of a grating 51, as schematically depicted in FIG. 2, a transmissive optical filter may also be applied. Optical filters transmissive for EUV, as well as optical filters less transmissive for or even substantially absorbing UV radiation, are known to skilled artisans. Hence, the use of "grating spectral purity filter" is herein further indicated interchangeably as a "spectral purity filter," which includes gratings or transmissive filters. Although not depicted in FIG. 2, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. Following the light path that a beam of radiation traverses through lithographic apparatus 200, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 2 (and additional optical elements not shown in the schematic drawing of this embodiment) may be vulnerable to deposition of contaminants produced by source SO, for example, Sn. Such may be the case for the radiation collector 50 and, if present, the spectral purity filter 51. Hence, a cleaning device may be employed to clean one or more of these optical elements, as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, may also be located along optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 2, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings may be present.

Reflectors 142, 143, and 146 respectively may include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the terms "lens" and "lens element," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength $\lambda$ of 365, 248, 193, 157 or 126 nm), extreme ultra-violet (EUV or soft X-ray) radiation (e.g., having a wavelength in the range of 5-20 nm, e.g., 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths, which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within lithographic apparatus. It should be appreciated that radiation having a wavelength in the range of, for example, 5-20 nm relates to radiation with a certain wavelength band, of which at least part is in the range of 5-20 nm.

II. Embodiments of a Mask Inspection System

Figure 3:
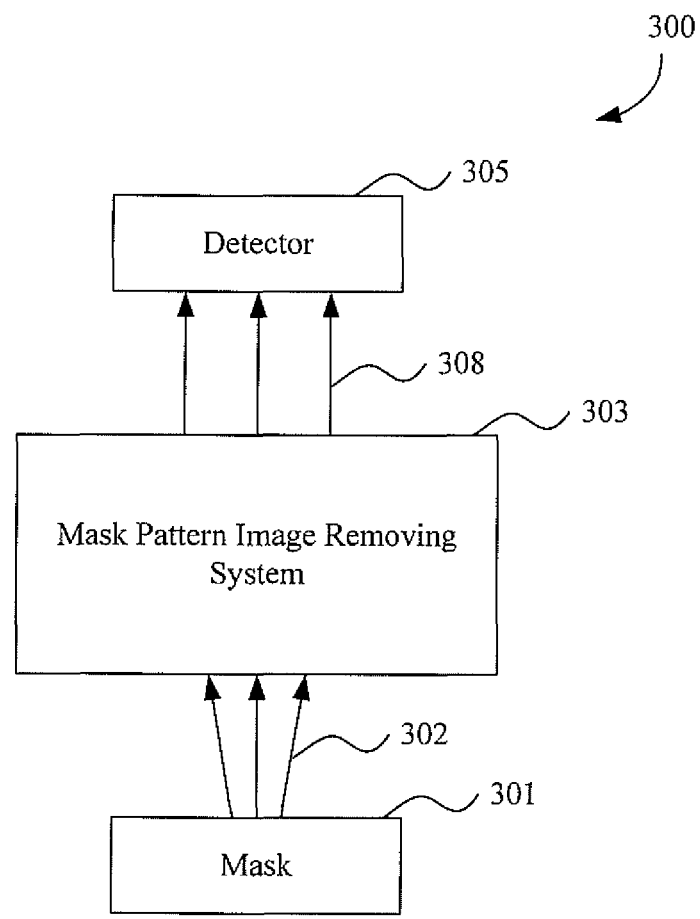
FIG. 3 is an illustration of an embodiment of a mask inspection system.

FIG. 3 is an illustration of an embodiment of a mask inspection system 300. The mask inspection system 300 includes a mask pattern image removing system 303 and a detector 305. Mask pattern image removing system 303 receives scattered light 302 from a mask 301. Scattered light 302 includes scattered light from a pattern (not shown) of mask 301 and scattered light from any possible irregularities, defects, etc. (hereinafter defects) on mask 301. Mask pattern image removing system 303 removes substantially all of the scattered light from the pattern of mask 301. Consequently, detector 305 detects substantially only scattered light 308 from the possible defects on mask 301.

Figure 4:
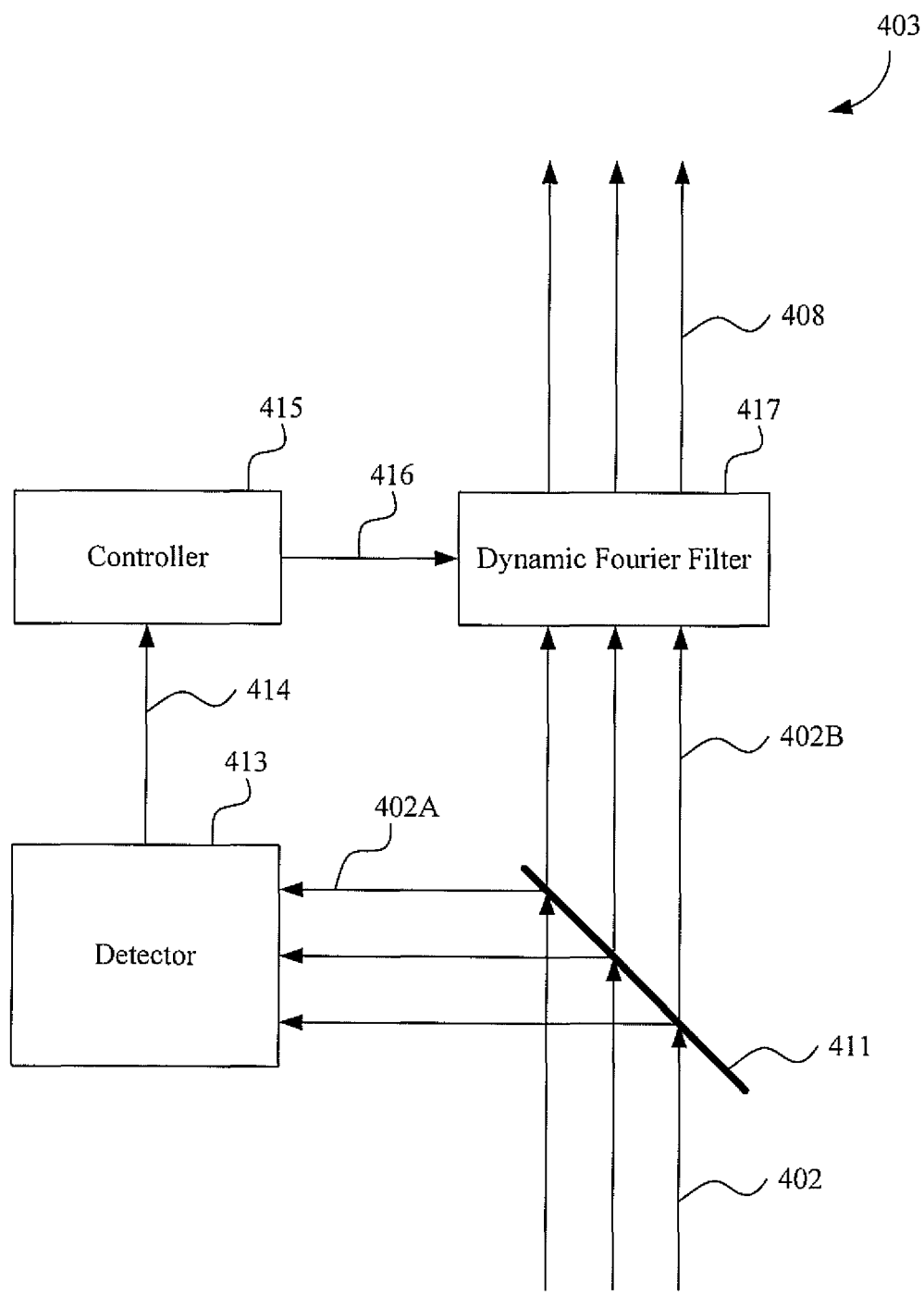
FIG. 4 is an illustration of an embodiment of a mask pattern image removing system that can be used in a mask inspection system.

FIG. 4 is an illustration of an embodiment of a mask pattern image removing system 403. For example, mask pattern image removing system 403 can be used as mask pattern image removing system 303 of FIG. 3. Mask pattern image removing system 403 includes a beam splitter 411, a detector 413, a controller 415, and a dynamic Fourier filter 417.

In an embodiment, beam splitter 411 receives scattered light 402 from a mask (e.g., mask 301 of FIG. 3). Beam splitter 411 splits scattered light 402 into first portion 402A and second portion 402B. Beam splitter 411 directs first portion 402A to detector 413 and second portion 402B to dynamic Fourier filter 417. Detector 413 and dynamic Fourier filter 417 are located upstream with respect to beam splitter 411 in a direction that scattered light 402 travels. A splitting ratio, e.g., how much of beam 402 forms 402A versus 402B, of the beam splitter can depend on detector 413 or detector 305 of FIG. 3 (for example the split ration can depend on sensitivity of the detectors).

In an embodiment, detector 413 is located at a Fourier plane of mask pattern image removing system 403. In one example, detector 413 comprises a CCD camera. However, other types of detectors may also be used.

In one example, controller 415 is connected to detector 413. Controller 415 is configured to receive a signal 414, which is representative of the detected first portion 402A, from detector 413. Controller 415 can further analyze Fourier field measurements of a pattern of the mask from the detected first portion 402A. Controller 415 can use the Fourier field measurements to produce a control signal 416, which is used to dynamically control dynamic Fourier filter 417.

In one example, dynamic Fourier filter 417 includes, but is not limited to, a digital mirror array, a light valve array, and etc. After being configured through receipt of control signal 416, dynamic Fourier filter 417 receives second portion 402B from beam splitter 411. Dynamic Fourier filter 417 is configured to substantially remove scattered light produced by the pattern of the mask. Consequently, scattered light 408 exiting dynamic Fourier filter 417 includes substantially only scattered light from any possible defects that exist on the mask.

In one embodiment, Fourier field measurements of the pattern of the mask from the detected first portion 402A (detected at detector 413) can include spatial frequency, magnitude, and phase information of the pattern of the mask. In one embodiment, the controller 415 can use this information to dynamically control dynamic Fourier filter 417. In one embodiment, Fourier filtering can be done by passing through some spatial frequencies of light and cutting off some other spatial frequencies of light. Fourier filter 417, in one example, can substantially cut off spatial frequencies of scattered light produced by the pattern of the mask based on spatial frequency, magnitude, and phase information of the pattern of the mask measured at Fourier field measurements and therefore, substantially remove scattered light produced by the pattern of the mask. Additionally or alternatively, by Fourier filtering in Fourier filter 417 spatial frequencies of scattered light from any possible defects that exist on the mask can substantially pass through and therefore, only scattered light from any possible defects that exist on the mask can substantially pass through Fourier filter 417.

In one example, mask inspection system 303 or 403 is able to detect any possible defects on an area of a mask more accurately and with higher resolution than previous systems. For example, defect size detection sensitivity can be enhanced by more that 10 times over systems that only use Fourier filtering. Also, some embodiments of the present invention can improve estimated inspection time over the previous systems.

Figure 5:
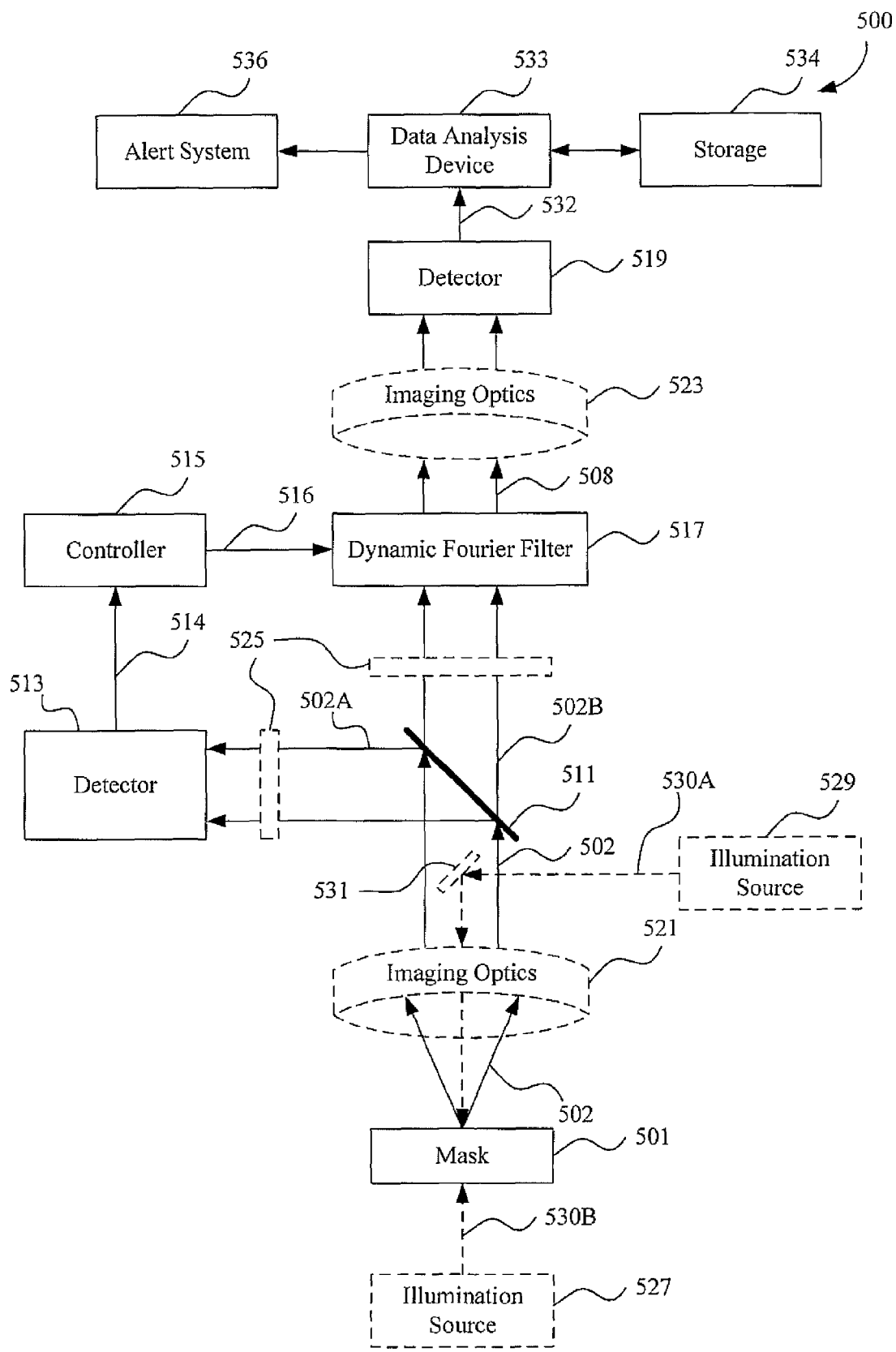
FIG. 5 is a detailed illustration of another embodiment of a mask inspection system.

FIG. 5 is an illustration of another embodiment of a mask inspection system 500. The mask inspection system 500 includes optional imaging optics 521 and 523, a beam splitter 511, a first detector 513, a controller 515, a dynamic Fourier filter 517, a second detector 519, optional masking apertures or baffles 525, and an optional data analysis device 533.

A mask 501 includes a pattern (not shown) and possible defects (not shown). Mask 501 is illuminated, as discussed below. Scattered light 502 from mask 501 is received by beam splitter 511. In one embodiment imaging optics 521 are configured to collect scattered light 502 and can remove zero diffraction order light before beam splitter 511 receives scattered light 502.

In one embodiment, mask inspection system 500 optionally includes an illumination source 529 and a reflective device 531. Illumination source 529 and the reflective device 531 can illuminate mask 501. In this embodiment, mask 501 is a reflective mask. Mask 501 can be, for example, an EUV reflective mask. The illumination light can reflect substantially normally from a surface of mask 501. Illumination source 529 can include, but is not limited to, a laser illumination source, an EUV illumination source, and the like.

Alternatively, in another embodiment, mask inspection system 500 optionally includes an illumination source 527 to illuminate mask 501. In this embodiment, mask 501 is a transmissive mask. The illumination light can be received substantially normal on a surface of mask 501. Illumination source 527 can include, but is not limited to, a laser illumination source, and the like.

In one example, scattered light 502 from mask 501 is received by beam splitter 511 and is split into a first portion 502A of scattered light and a second portion 502B of scattered light. First portion 502A is directed by beam splitter 511 to detector 513. Detector 513 is located at a Fourier plane of mask inspection system 500 and is configured to detect first portion 502A of scattered light.

In one example, controller 515 is coupled to detector 513, and is configured to receive a signal 514 representative of the detected first portion 502A of scattered light. Controller 515 is configured to measure a Fourier field of the detected first portion 502A of scattered light to produce a control signal 516. Based on the Fourier field measurements, controller 515 uses signal 516 to configure and control dynamic Fourier filter 517.

In one example, dynamic Fourier filter 517 also receives second portion 502B of scattered light from beam splitter 511. Dynamic Fourier filter 517 is configured to substantially remove all scattered light produced by the pattern of mask 501 from the second portion 502B of scattered light. Consequently, scattered light 508 that exits the dynamic Fourier filter 517 substantially includes only scattered light produced by any possible defects that may exist on mask 501.

In one embodiment, mask inspection system 500 includes optional masking apertures or baffles 525. Masking apertures 525 are placed at intermediate image planes to define a leading part and a trailing part of inspection. The leading part of inspection is defined as the area that scattered light travels from mask 501 to detector 513 at the Fourier plane. The trailing part of inspection is defined as the area that scattered light travels from mask 501 to dynamic Fourier filter 517. Masking apertures 525 can be adjusted to compensate for any time delays that may occur between a time period or duration detector 513 detects first portion 502A of scattered light and a time period or duration dynamic Fourier filter 517 is configured based on control signal 516. For example, analyzing the Fourier field measurements and controlling dynamic Fourier filter 517 can occur slightly ahead of the dynamically filtering second portion 502B of scattered light. Masking apertures 525 can include, but are not limited to, baffles, shutters blades, and etc.

In one example, after second portion 502B of scattered light traverses through dynamic Fourier filter 517, filtered second portion 508 of scattered light is detected by a detector 519. In one embodiment, detector 519 can be placed at an image plane of mask inspection system 500. In one embodiment, mask inspection system 500 can include an optional imaging optics 523 that are used to process and direct filtered second portion 508 of scattered light onto detector 519. In this example configuration, filtered second portion 508 of scattered light includes substantially only scattered light produced by any possible defects of mask 501. Scattered light produced by the pattern of mask 501 is substantially filtered out by dynamic Fourier filter 517.

In one example, mask inspection system 500 further includes a data analysis device 533. Data analysis device 533 is connected to detector 519 and is configured to receive a signal 532 representative of detected filtered second portion 508 of scattered light for further analysis. In one embodiment, data analysis device 533 is configured to compare detected filtered second portion 508 of scattered light with another scattered light. In one embodiment, the another scattered light has previously been detected by mask inspection system 500 and has been stored in a memory or database 534. In another example, the another scattered light can be from a same area of mask 501 or can be from a same area of another mask (not shown) with a similar pattern. Additionally, or alternatively, the another scattered light can be from another area of a mask with a substantially identical pattern. In another embodiment, the another scattered light can be reference data that is stored in a design database 534. In another embodiment, as will be explained in more detail in FIG. 7, the another scattered light is detected substantially at the same time the filtered second portion 508 of scattered light is detected by detector 519. Additionally, or alternatively, data analysis device 533 is configured to subtract the detected filtered second portion 508 of scattered light and another scattered light. The another scattered light can include any of scattered light mentioned above. In one embodiment, data analysis device 533 is configured to normalize detected filtered second portion 508 or its representative before subtracting.

In one embodiment, data analysis device 533 is configured to optionally normalize signal 532 representative of detected filtered second portion 508 of scattered light before device 533 compares signal 532 to the another scattered light. This can improve the detection of possible defects on the mask.

In one example, by comparing signal 532 with the another scattered light, data analysis device 533 is able to remove any residual scattered light produced by the pattern of mask 501 that might have passed through dynamic Fourier filter 517. Consequently, mask inspection system 500 enhances detection of any possible defects that may exist on mask 501. In one embodiment, data analysis device 533 is configured to initialize an alert system 536 that alerts a user or system that mask 501 includes defects. In one embodiment, data analysis device 533 is configured to determine size and location of the defects on mask 501. Depending on the size and the location of the defects with respect to the pattern of mask 501, and the criticality of the defects, mask 501 can be replaced or removed for a cleaning process.

In one example, a wavelength of the illumination light used in mask inspection system 500 and a numerical aperture of the inspection channel can be calculated or adjusted in order to improve the defect detection capability of mask inspection system 500. The shorter the wavelength of the illumination light, the higher a resolution of mask inspection system 500. Also, the higher the numerical aperture of the inspection channel, the higher the resolution of mask inspection system 500. As an example, illumination light with 193 nm or 266 nm and an inspection channel with a numerical aperture of about 0.95 can be used.

In one embodiment, mask inspection system 500 can be used as an inspection module attached to an exposure tool in a lithographic apparatus, for example one shown in FIG. 1A or 1B. In this embodiment, a mask can be transferred to the module, an inspection can be run on the mask, and the mask can be transferred to the exposure tool for a lithographic process. Alternatively, in another embodiment, the mask inspection system 500 can be separate from the lithographic apparatus.

In one example, mask inspection system 500 can be used to inspect any optical mask, for example, mask inspection system 500 can be used to inspect patterned EUV mask in vacuum, mask inspection system 500 can be used to inspect a front-side or a back side of an EUV mask. In one embodiment patterns on mask 501 are periodic patterns.

Figure 6:
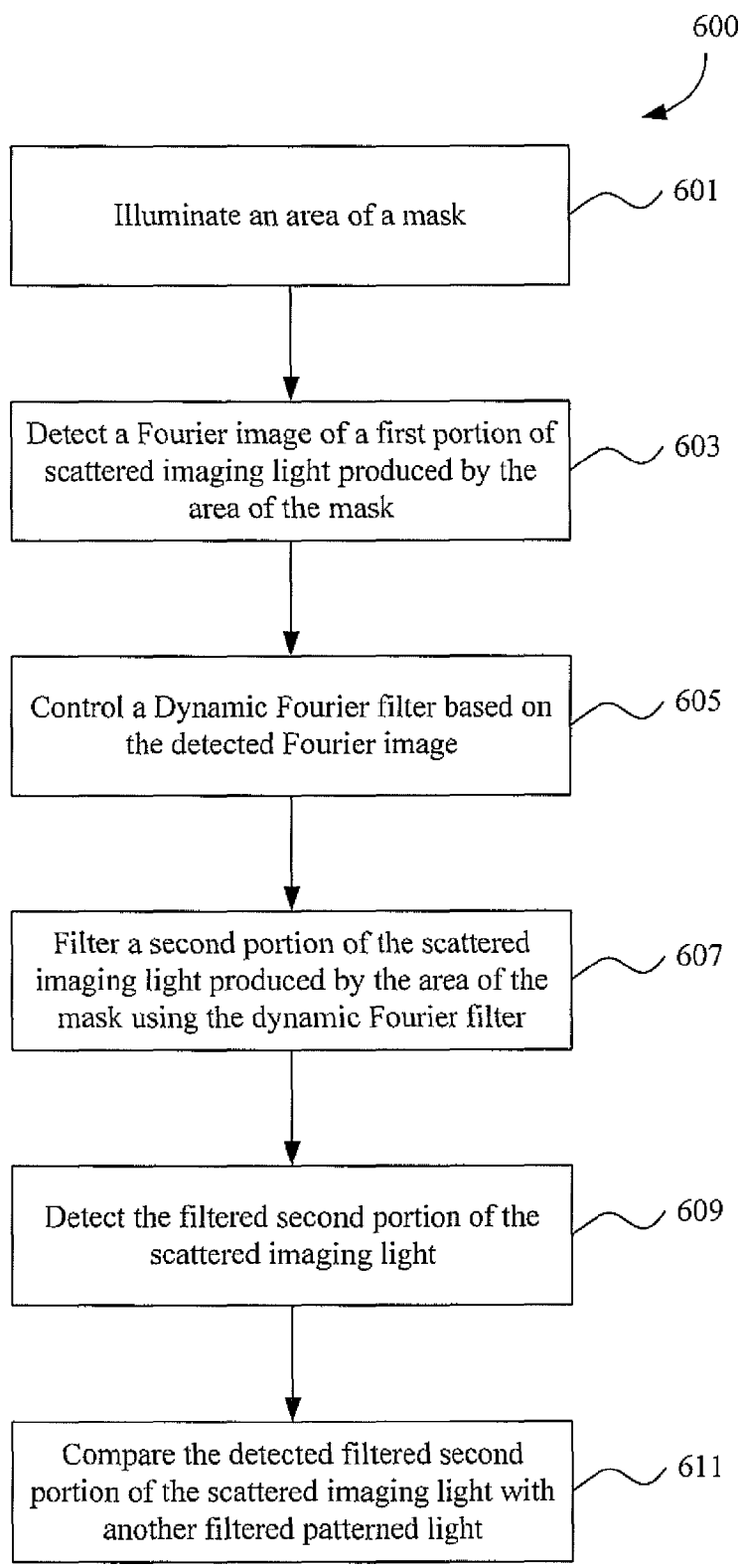
FIG. 6 is an illustration of an embodiment of a method for inspecting a mask.

FIG. 6 is an illustration of an embodiment of a method 600 for inspecting a mask for defects. Method 600 can occur using, for example, mask inspection system 300, 403, or 500 described above with respect to FIG. 3, 4, or 5.

In step 601, an area of the mask is illuminated with radiation beam.

In step 603, a first portion of scattered light produced by the area of the mask is received by a detector to detect a Fourier image of the first portion of the scattered light.

In step 605, the detected Fourier image of the first portion of the scattered light is used to set up and control a dynamic Fourier filter.

In step 607, a second portion of scattered light traverses through the dynamic Fourier filter and scattered light produced by a pattern of the area of the mask is substantially removed from the second portion of scattered light.

In step 609, the filtered second portion of scattered light, which substantially includes scattered light produced by any possible defects on the area of the mask, is received and detected by a detector.

In optional step 611, a detected filtered second portion of scattered light is compared with another patterned light. By the comparison, any residual scattered light produced by the pattern of the area of the mask that might have passed through the filter can be removed. Consequently, the defect detection is enhanced. In one embodiment, comparing the detected filtered second portion of scattered light with the another patterned light can include, but is not limited to, subtracting the detected filtered second portion of scattered light and the another patterned light.

In one embodiment, the another scattered light has previously been detected by the mask inspection system and has been stored in a database. The another scattered light can be from the same area of the same mask or can be from the same area of another mask with similar pattern. Additionally, or alternatively, the another scattered light can be from another area of the same mask with substantially identical pattern. In another embodiment, the another scattered light can be reference data that is stored in a design database. In another embodiment, as will be explained in more detail in FIG. 7, the another scattered light and the filtered second portion of scattered light are detected continuously and substantially at the same time.

Figure 7:
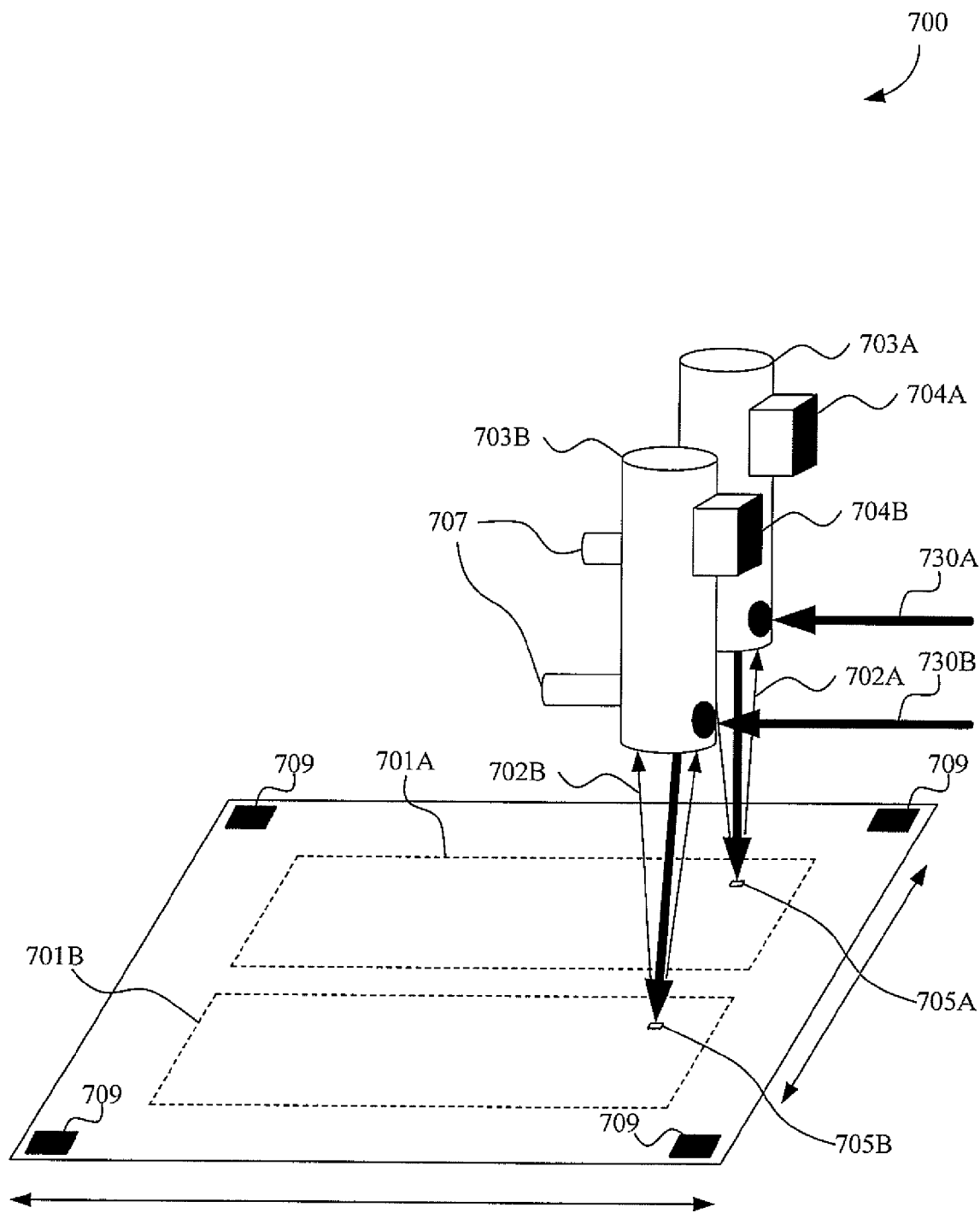
FIG. 7 is an illustration of another embodiment of a mask inspection system.

FIG. 7 is an illustration of a mask inspection system 700. Mask inspection system 700 can include at least two optical channels 703A and 703B. Each optical channel 703A or 703B can include a mask inspection system, for example mask inspection system 300, 403, and 500 shown in FIGS. 3, 4, and 5. Fourier plane detectors (for example detector 413 of FIG. 4) can be placed at Fourier planes 707.

Mask inspection system 700 can be used to inspect inspection zones 705A and 705B on mask patterns 701A and 701B, respectively. In one example, mask patterns 701A and 701B have substantially identical patterns except for any possible defects that may exist on them. Illumination beams 730A and 730B are directed by optical channels 703A and 703B, respectively, to inspection zones 705A and 705B on mask patterns 701A and 701B. Scattered light 702A and 702B from inspection zones 705A and 705B is directed to optical channels 703A and 703B.

In one example, as discussed above, with respect to FIGS. 3-6, in each optical channel, light scattered from a pattern of its respective inspection zone is substantially removed from the overall scattered light using dynamic Fourier filter (not shown) to isolate the scatted light including information regarding defects. Resulting filtered scattered light (not shown) from inspection zones 705A and 705B is detected. Representations of detected filtered scattered light are compared with each other using a data analysis device (not shown). By comparing representations, possible residual scattered light from pattern of inspection zones 705A and 705B that might have passed through dynamic Fourier filters is removed. For example, detection of any possible defects that may exist on inspection zones 705A and 705B and are not common features of inspection zones 705A and 705B is improved. In one embodiment, locations of inspection zones 705A and 705B can be measured from mask stage coordinates and illumination beam references.

In one embodiment, optical channels 703A and 703B synchronously inspect mask patterns 701A and 701B. Resulting representations of detected Fourier filtered patterned lights from optical channels 703A and 703B are continuously compared with each other.

In one embodiment, a mask plate, which carries mask patterns 701A and 701B, includes mask alignment keys 709. Mask alignment keys 709 can be used to align optical channels 703A and 703B. In one embodiment, fine tuning of alignment between optical channels 703A and 703B can be achieved by aligning representations of residual scattered light produced by patterns of inspection zones 705A and 705B. In another embodiment, residual scattered light produced by patterns of inspection zones 705A and 705B can be enhanced by reducing an efficiency of the Fourier filters in optical channels 703A and 703B to improve alignment.

In one embodiment, an average of representations of detected scattered light by detectors (not shown) at Fourier plane 707 of optical channels 703A and 703B is used to configure and control dynamic Fourier filters (not shown) of optical channels 703A and 703B. In another embodiment, only one of optical channels 703A and 703B includes a detector (not shown) at Fourier plane 707. The one detector is used to configure and control dynamic Fourier filters (not shown) of both optical channels 703A and 703B. In another embodiment, representations of filtered scattered light that are detected in both channels 703A and 703B are normalized before being compared to each other. If a dynamic Fourier filter is not available, in one embodiment, fixed preset Fourier plane blocking filters can be matched and used in each optical channel 703A and 703B. However, using fixed preset Fourier plane blocking filters instead of dynamic Fourier filters can reduce filtering efficiency and decrease effectiveness of mask inspection system 700.

In one embodiment scanners 704A and 704B can be used to scan optical channels 703A and 703B, respectively, over mask patterns 701A and 701B in different scan directions. In one example, scanners 704A and 704B can scan optical channels 703A and 703B over mask patterns 701A and 701B synchronously. In another embodiment, mask patterns 701A and 701B can move in scanning directions such that they can be scanned by optical channels 703A and 703B.

Figure 8A:
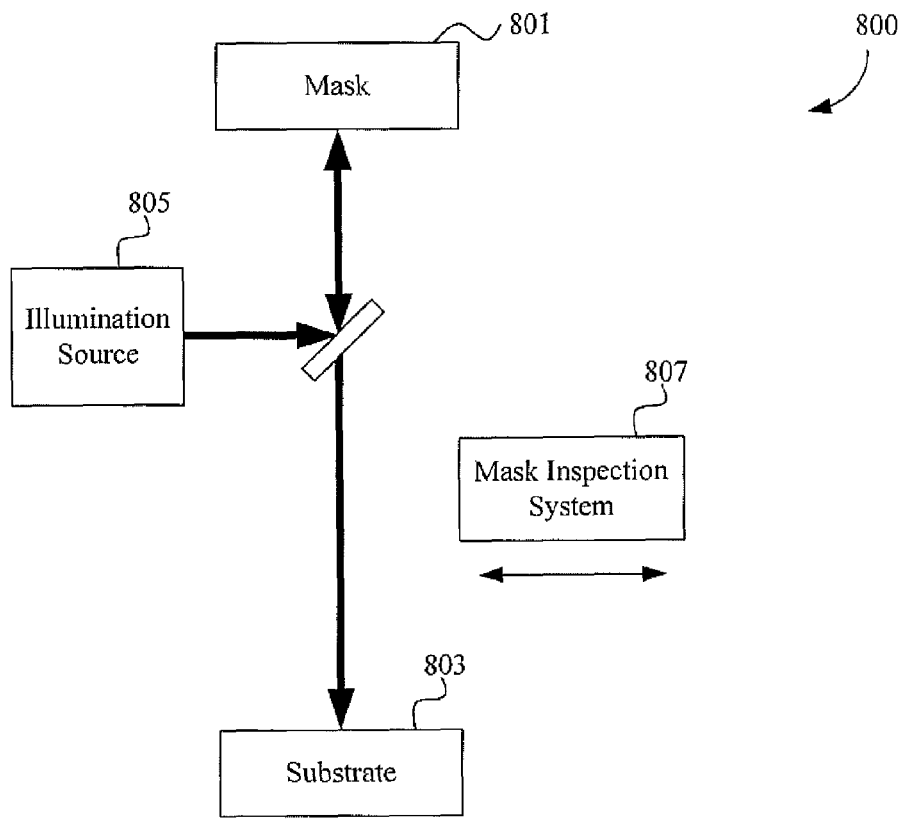
FIG. 8A is an illustration of an embodiment of an exposure phase of a lithographic apparatus.
Figure 8B:
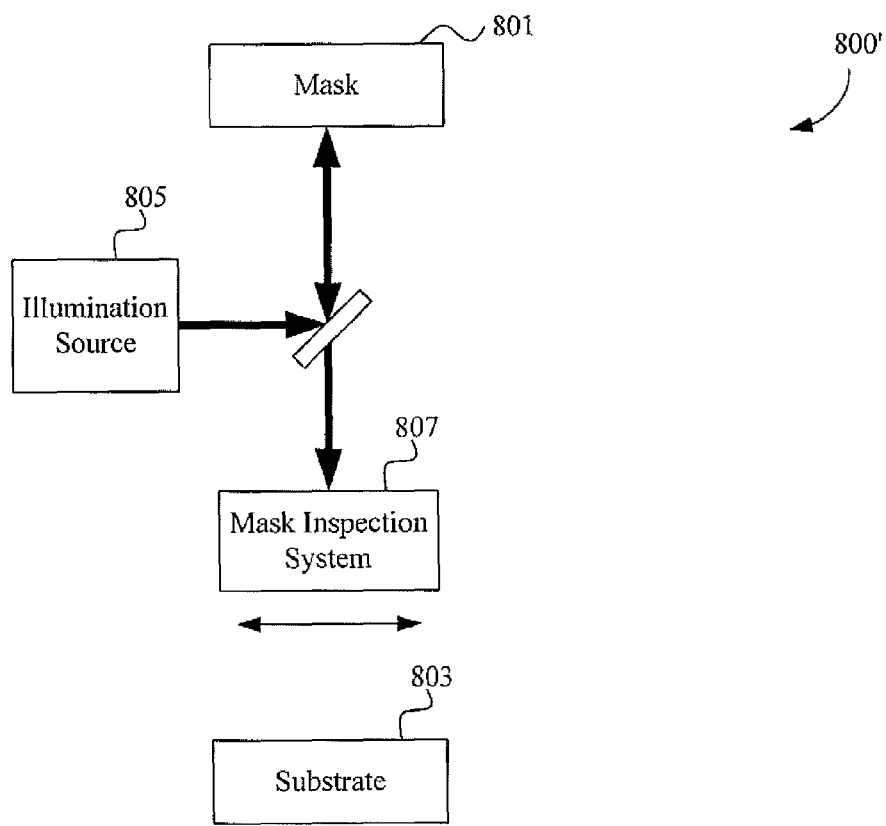
FIG. 8B is an illustration of an embodiment of an inspection phase of a lithographic apparatus.

FIG. 8A is an illustration of an embodiment of an exposure phase 800 of a lithographic apparatus. FIG. 8B is an illustration of an embodiment of an inspection phase 800' of a lithographic apparatus. FIGS. 8A and 8B are illustrations of one example of how mask inspection system 807 can work with a lithographic apparatus, e.g., by moving mask inspection system 807 between a position during exposure, FIG. 8A, and a position during inspection, FIG. 8B. FIG. 8A is an illustration of an exposure phase 800. In exposure phase 800, illumination source 805 can illuminate a target portion (not shown) of mask 801. After being reflected from mask 801, patterned light is focused on a target portion (not shown) of substrate 803 to form patterns or features on substrate 803. During exposure phase 800, mask inspection system 807 is offline or moved away from the patterning beam from mask 801.

FIG. 8B is an illustration of an inspection phase 800'. In inspection phase 800', mask inspection system 807 can be moved into a beam path of the patterned beam, between mask 801 and substrate 803, In one example, mask inspection system 807 can include, for example, mask inspection system 300, 403, or 500 shown in FIGS. 3, 4, 5, and 7. In inspection phase 800', illumination source 805 illuminates mask 801. Scattered light from mask 801 is received and processed by mask inspection system 807 to detect any possible defects that may exist on mask 801.

Figure 9A:
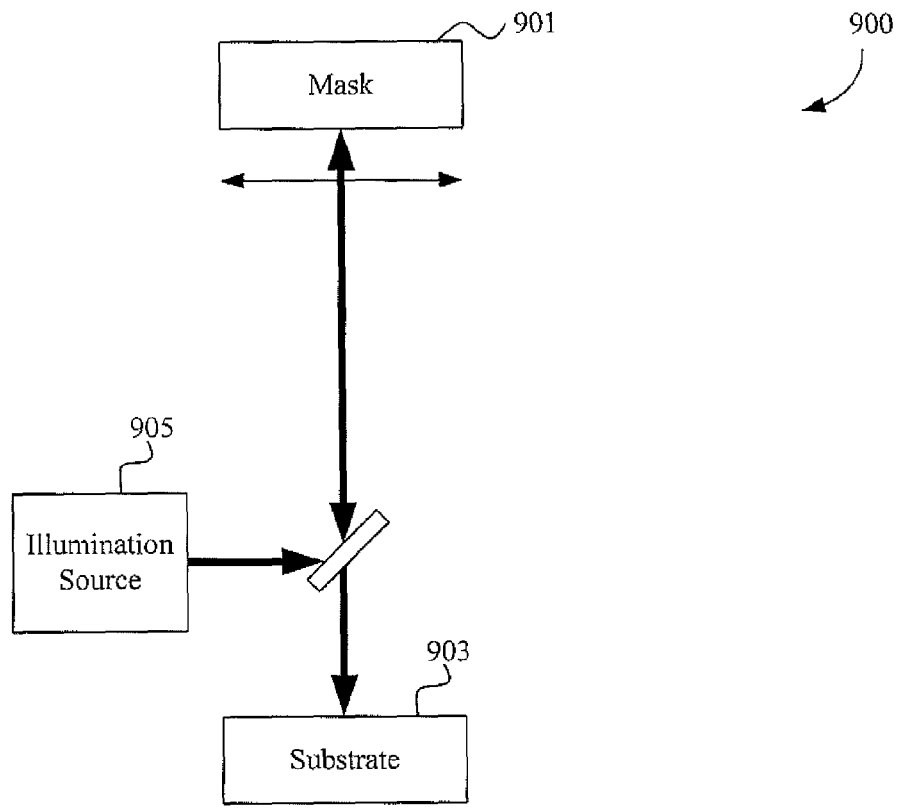
FIG. 9A is an illustration of another embodiment of an exposure phase of a lithographic apparatus.
Figure 9B:
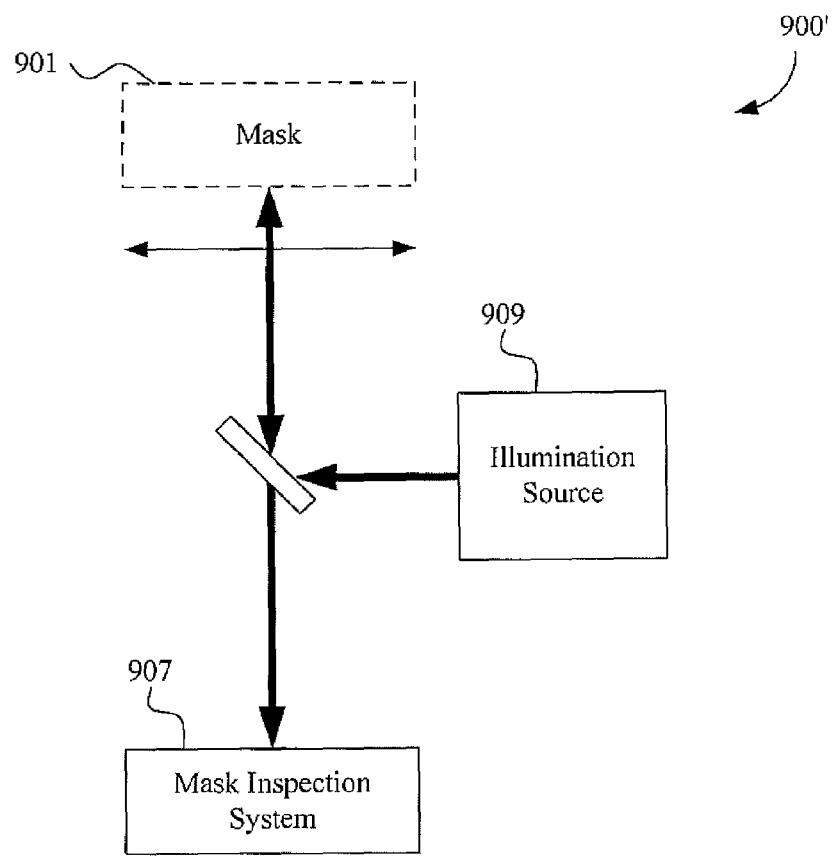
FIG. 9B is an illustration of another embodiment of an inspection phase of a lithographic apparatus.

FIG. 9A is an illustration of another embodiment of an exposure phase 900 of a lithographic apparatus. FIG. 9B is an illustration of another embodiment of an inspection phase 900' of a lithographic apparatus. FIGS. 9A and 9B illustrate another example of how mask inspection system 907 can work with a lithographic apparatus, e.g., by moving mask 901 from an exposure position, as seen in FIG. 9A, to an inspection position, as seen in FIG. 9B During exposure phase 900, illumination source 905 can illuminate a target portion (not shown) of mask 901. After being reflected from mask 901, patterned light is focused on a target portion (not shown) of substrate 903 to form patterns or features on substrate 903. During exposure phase 900, mask inspection system 907 is offline or removed from a path of the patterned beam.

FIG. 9B is an illustration of an inspection phase 900'. In inspection phase 900', mask 901 can be moved to be inspected. During inspection phase 900', mask 901 is illuminated by illumination source 909. Scattered light from mask 901 is received and processed by mask inspection system 907 to detect any possible defects that may exist on mask 901. The mask inspection system 907 can include for example mask inspection system 300, 403, or 500 shown in FIGS. 3, 4, 5, and 7.

III. Conclusion

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A system comprising:
    a first detector located at a first Fourier plane and configured to detect a first portion of a first patterned light produced by a first section of a first mask;
    a first dynamic Fourier filter;
    a first controller configured to control the first dynamic Fourier filter based on the first portion of the first patterned light;
    a second detector configured to detect a second portion of the patterned light produced by the first section of the first mask after the second portion of the first patterned light transmits through the first dynamic Fourier filter;
    a first baffle located along a first optical path between the first mask and the first detector;
    a second baffle located along a second optical path between the first mask and the first dynamic Fourier filter,
    wherein the first baffle and the second baffle are configured to be adjusted to compensate for time delays in detection of the first portion of the first patterned light by the first detector and control of the first dynamic Fourier filter by the first controller; and
    a data analysis device configured to compare the second portion of the first patterned light with another patterned light.

2. The system of claim 1, further comprising:
    a beam splitter configured to:
        split the first patterned light;
        direct the first portion of the first patterned light towards the first detector; and
        direct the second portion of the first patterned light towards the second detector.

3. The system of claim 2, wherein:
    the first baffle is located between the beam splitter and the first detector; and
    the second baffle is located between the beam splitter and the second detector.

4. The system of claim 1, wherein the first dynamic Fourier filter is a digital mirror array.

5. The system of claim 1, wherein the first dynamic Fourier filter is a light valve array.

6. The system of claim 1, wherein the first detector is a CCD camera.

7. The system of claim 1, further comprising:
    a third detector located at a second Fourier plane and configured to detect a third portion of a second patterned light produced by a second section of a second mask;
    a second dynamic Fourier filter;
    a second controller configured to control the second dynamic Fourier filter based on the third portion of the second patterned light produced by the second section of the second mask; and
    a fourth detector configured to detect a fourth portion of the second patterned light after the fourth portion transmits through the second dynamic Fourier filter.

8. The system of claim 7, wherein the first mask and the second mask comprises substantially a similar mask pattern.

9. The system of claim 1, wherein:
    information representative of the another patterned light produced by a second section of a second mask is stored in a storage device; and
    the first mask and the second mask comprises substantially a similar mask pattern.

10. The system of claim 1, wherein:
    information representative of the another patterned light produced by a second section of the first mask is stored in a storage device; and
    the first section and the second section of the first mask comprises substantially a similar mask pattern.

11. The system of claim 1, further comprising:
    a third detector located at a second Fourier plane and configured to detect a third portion of a second patterned light produced by a second section of the first mask;
    a second dynamic Fourier filter;
    a second controller configured to control the second dynamic Fourier filter based on the third portion of the second patterned light; and
    a fourth detector configured to detect a fourth portion of the second patterned light after the fourth portion transmits through the second dynamic Fourier filter, wherein:
    the data analysis device is configured to compare the second portion of the first patterned light with the fourth portion of the second patterned light; and
    the first section and the second section of the first mask comprises substantially a similar mask pattern.

12. A method comprising:
    detecting a first Fourier image of a first portion of a first patterned light produced by a first mask;
    controlling a first Fourier filter based on the detected first Fourier image;
    filtering a second portion of the first patterned light using the first Fourier filter;
    adjusting a first baffle and a second baffle to compensate for time delays in the detecting of the first Fourier image and the controlling of the first Fourier filter;
    detecting the filtered second portion; and
    comparing the filtered second portion with another patterned light.

13. The method of claim 12, further comprising:
    normalizing the filtered second portion before the comparing.

14. The method of claim 12, further comprising:
    detecting a second Fourier image of a third portion of a second patterned light produced by a second mask;
    controlling a second Fourier filter based on the detected second Fourier image;
    filtering a fourth portion of the second patterned light using the second Fourier filter; and
    detecting the filtered fourth portion of the second patterned light.

15. The method of claim 14, wherein the first mask and the second mask comprises substantially a similar mask pattern.

16. The method of claim 15, wherein the comparing comprises:
comparing the filtered second portion of the first patterned light with the filtered fourth portion of the second patterned light.

17. The method of claim 14, further comprising:
generating an averaged Fourier image based on the first Fourier image and the second Fourier image; and
controlling the first Fourier filter and the second Fourier filter based on the averaged Fourier image.

18. A lithography system comprising:
a support configured to support a patterning structure, the patterning structure configured to pattern a beam of radiation during at least one of an exposure phase and an inspection phase;
a substrate table configured to hold a substrate;
a projection system configured to project the patterned beam onto a target portion of the substrate during the exposure phase; and
a patterning structure inspection system configured to inspect an area of the patterning structure during the inspection phase, the patterning structure inspection system comprising:
a beam splitter configured to:
receive patterned light from the area of the patterning structure; and
split the patterned light to a first portion of the patterned light and a second portion of the patterned light;
a first detector located at a Fourier plane and configured to detect the first portion directed by the beam splitter;
a dynamic Fourier filter;
a controller configured to control the dynamic Fourier filter based on the detected first portion of the patterned light;
a second detector configured to detect the second portion of the patterned light after the second portion transmits through the dynamic Fourier filter;
first baffle located along a first optical path between the patterning structure and the first detector;
a second baffle located along a second optical path between the patterning structure and the dynamic Fourier filter,
wherein the first baffle and the second baffle are configured to be adjusted to compensate for time delays in detection of the first portion and control of the dynamic Fourier filter; and
a data analysis device configured to compare the second portion of the patterned light with another patterned light.

19. A scanning detection system comprising:
an optics channel comprising:
a first detector located at a Fourier plane and configured to detect a Fourier field of a first patterned light produced by a section of a mask having a mask pattern; and
a dynamic Fourier filter located in a primary imaging path;
a controller configured to control the dynamic Fourier filter based on the Fourier field of the first patterned light to substantially remove both the first patterned light produced by the mask pattern and a second patterned light in the primary imaging path produced by the mask pattern;
a first baffle located along an optical path between the mask and the first detector; and
a second baffle located along the primary imaging path between the mask and the dynamic Fourier filter,
wherein the first baffle and the second baffle are configured to be adjusted to compensate for time delays in detection of the first Fourier field and control of the dynamic Fourier filter.

20. A method comprising:
detecting, using a first detector at a first optics channel, a Fourier field of a first patterned light produced by a section of a mask having a mask pattern, wherein the first detector is located at a Fourier plane;
controlling, using a first controller, a dynamic Fourier filter, located in a primary imaging path, based on the Fourier field of the first patterned light to substantially remove both the first patterned light produced by the mask pattern and a second patterned light in the primary imaging path produced by the mask pattern; and
adjusting a first baffle and a second baffle to compensate for time delays in the detecting of the Fourier field and the controlling of the dynamic Fourier filter.

* * * * *

UNITED STATES PATENT AND TRADEMARK OFFICE
CERTIFICATE OF CORRECTION

| | | |
|---|---|---|
| PATENT NO. | : 9,041,903 B2 | Page 1 of 1 |
| APPLICATION NO. | : 13/256372 | |
| DATED | : May 26, 2015 | |
| INVENTOR(S) | : Nelson et al. | |

It is certified that error appears in the above-identified patent and that said Letters Patent is hereby corrected as shown below:

In the claims,
Column 9, line 41, claim 18, please insert --a-- before "first baffle located".

Signed and Sealed this
Ninth Day of February, 2016

Michelle K. Lee
*Director of the United States Patent and Trademark Office*